United States Patent [19]

Ehling et al.

[11] Patent Number: 5,923,164

[45] Date of Patent: Jul. 13, 1999

[54] APPARATUS AND METHOD FOR AUTOMATICALLY TUNING THE GAIN OF AN AMPLIFIER

[75] Inventors: Ernst Ehling, Neuhausen; Ernst Gass, Stuttgart, both of Germany; Joszef Geisz, Veszprem, Hungary

[73] Assignee: Balluff, Inc., Florence, Ky.

[21] Appl. No.: 08/730,755

[22] Filed: Oct. 15, 1996

[51] Int. Cl.$^6$ .............................. G01B 7/14; G01F 23/30; H03G 3/10

[52] U.S. Cl. ................................ 324/207.13; 324/207.12; 330/279; 327/306

[58] Field of Search .......................... 324/207.12, 207.13, 324/207.24; 330/278, 279, 110; 327/306, 308, 323, 324

[56] References Cited

U.S. PATENT DOCUMENTS

| | | | |
|---|---|---|---|
| 3,539,936 | 11/1970 | McGhee | 330/279 |
| 3,898,555 | 8/1975 | Tellerman . | |
| 4,943,773 | 7/1990 | Koski et al. | 324/207.13 |
| 4,952,873 | 8/1990 | Tellerman . | |
| 5,115,193 | 5/1992 | Bean et al. . | |
| 5,206,586 | 4/1993 | Yauch et al. . | |
| 5,212,444 | 5/1993 | Abramovich et al. . | |
| 5,233,309 | 8/1993 | Spitainy et al. . | |
| 5,253,522 | 10/1993 | Nyce et al. . | |
| 5,311,124 | 5/1994 | Hubbard et al. . | |
| 5,313,160 | 5/1994 | Gloden et al. . | |
| 5,334,933 | 8/1994 | Tellerman . | |
| 5,367,255 | 11/1994 | Nyce et al. | 324/207.13 |
| 5,545,984 | 8/1996 | Gloden et al. . | |
| 5,590,091 | 12/1996 | Gloden et al. . | |
| 5,640,109 | 6/1997 | Nyce . | |

FOREIGN PATENT DOCUMENTS 0149745  8/1988  European Pat. Off. .

*Primary Examiner*—Walter E. Snow
*Attorney, Agent, or Firm*—Dinsmore & Shohl LLP

[57] ABSTRACT

An apparatus and method for automatically and periodically tuning a signal having a gain element, a variable impedance associated with the gain element, and a control device. The gain element has an input for receiving the signal and an output for providing an output signal and is preferably an operational amplifier with a feedback path extending from the output to the input. The variable impedance is preferably connected in series in the feedback path and includes a plurality of resistors connected in series and a plurality of switches, each switch being connected in parallel with one of the resistors. The control device receives the gain element output signal and generates a control signal in response to the amplitude of the gain element output signal. The control signal is transmitted to the variable impedance for regulating the setting of the impedance. Preferably, the control device also includes a pair of comparators for evaluating the gain element output signal and a field programmable gate array for receiving the outputs of the comparators and generating the control signal. The control signal preferably comprises a plurality of switching signals, each signal being connected to one of the switches for controlling the state of the switch.

25 Claims, 5 Drawing Sheets

APPARATUS AND METHOD FOR AUTOMATICALLY TUNING THE GAIN OF AN AMPLIFIER

TECHNICAL FIELD

The present invention relates to an apparatus and method for automatically tuning a signal and, more particularly, to an automatic signal tuning apparatus having a gain element and a variable impedance associated with the gain element which is automatically and periodically varied based upon the level of the signal produced by the gain element. Furthermore, the present invention relates to a method for automatically and periodically tuning a signal which includes comparing the signal to a minimum reference voltage and a maximum reference voltage and using the results of the comparison to vary the impedance associated with a gain element.

BACKGROUND OF THE INVENTION

Many signal processing devices and electronic devices, including field programmable gate arrays, require that signals input to the devices be amplified. However, if the signal is over-amplified, the devices may become overpowered, resulting in errors in the processing operation. If the signal is under-amplified, the device may fail to detect the signal or to process the signal properly. Thus, in order to prevent erroneous processing by a signal processing device, the signal to be processed often must be amplified so that the voltage level of the signal is within a particular voltage range.

Unfortunately, the amount of amplification that is required can vary, even for signals produced by the same type of equipment. These variances can be linked to at least two causes. First, pieces of equipment that produce signals often operate in varying environments. Second, the user of the equipment sometimes replaces parts of the equipment with parts that differ from the factory original. As one might expect, such variations in operating conditions and parts often cause variations in the signal produced by the equipment. Thus, in order to maintain the signal within the optimum voltage range, some provisions must be made to ensure that the amount of amplification is adjusted or tuned. In the past, tuning of such equipment was generally complex and inconvenient, as it often required skilled technicians very familiar with the equipment and its operation. These requirements also made maintenance and replacement of the equipment time consuming and expensive.

An example of an application in which it is desirable to maintain a signal within a predetermined range is a linear displacement detector, such as available from Balluff, Inc. and others. A linear displacement detector is a device that measures the linear position of an object. One type of linear displacement detector is a magnetostrictive linear displacement transducer, an example of which is described in European Patent No. 0 149 745 B1 which is assigned to the Assignee of the present application. Typically, a magnetostrictive linear displacement transducer includes a signal generator, a magnetostrictive waveguide, a magnet, a mode convertor, and a displacement determination device. In the transducer, the magnet is disposed linearly along the waveguide. The magnet is connected to an object, so that the position of the magnet corresponds with the position of the object. When an excitation signal is provided near the magnet and waveguide by the signal generator, a mechanical wave, known as a torsion wave, is produced in the waveguide at the position of the magnet. Once the wave is produced, it travels through the waveguide outwardly from the magnet to the mode converter, where it is converted by the mode convertor into an electrical signal. Such a conversion of a mechanical wave into an electrical signal is known as the Wiedemann effect and is typically achieved by using a coil as the mode convertor.

Once the torsion wave is converted into an electrical signal, the signal passes to a displacement determination device. The device determines the distance traveled by the torsion wave, and thus the position of the object, based upon the interval of time between the production of the excitation signal and the production of the signal by the mode convertor. Usually, the device that measures or indicates the time interval is a signal processor or integrated circuit, such as a field programmable gate array, that requires the signal generated by the mode converter to be maintained within a predetermined voltage range in order for proper operation. An amplification stage is often utilized to amplify the signal from the mode convertor so that it falls within the desired range. Unfortunately, because the temperature of the environment in which the transducer operates, as well as the magnet position, affects the amplitude of the signal generated by the mode convertor, even the amplified signal may fall outside of the desired range in certain environments. In addition, different types of magnets may affect the amplitude of the mode convertor signal differently, thus causing the amplified signal to fall outside of the desired range.

Currently, there are a limited number of options available to account for the variables that affect the signal. One such option is to custom-manufacture each transducer to account for the temperature in which the transducer will operate and the type of magnet and waveguide with which it will be used. The customization process includes selecting the proper feedback impedance for the amplification stage and, thus, the proper amplification level. Another option is to tune the unit upon installation to account for the temperature in which the unit will operate, as well as the type of magnet, distance from the waveguide to the magnet, and waveguide to be used. Such tuning can be accomplished by including an impedance selector in the feedback path of the amplification stage and selecting the proper impedance upon installation of the transducer. As mentioned above, these options have proven to be expensive and time-consuming.

Furthermore, prior tuning procedures cannot account for changes to the transducer that may occur after the transducer has been initially installed. For example, if the temperature at the site of operation varies significantly, or if the magnet or waveguide is replaced with parts that differ from the originals, the feedback impedance often must be manually readjusted or replaced in order for the amplified signal to be within the desired range.

Another problem frequently encountered with magnetostrictive linear displacement transducers involves the conductive wire used to transmit the excitation signal produced by the signal generator. Shocks or vibrations within the transducer may cause the conductive wire to contact the waveguide, causing momentary variations of the signal and failure of the transducer. This can be a problem particularly when a solid wire is used for the conductive wire. Such failures can lead to undesirable "crashes" of machinery and equipment, which can create further problems and unreliability.

Accordingly, to overcome the above and other problems, it is desirable to have an apparatus and method for automatically and periodically tuning a signal to within a predetermined voltage range which eliminates the need for manual adjustment or replacement of the amplification stage. Furthermore, it is desirable to have such an apparatus which can be utilized within a linear displacement detector. In addition, it is desirable to have a magnetostrictive linear displacement transducer that is less sensitive to shocks, vibrations, the environment, ambient temperatures and differences between magnets.

SUMMARY OF THE INVENTION

Accordingly, it is a principal object of the present invention to provide an apparatus and method for automatically and periodically tuning a signal.

In particular, it is a principal object of the present invention to provide an apparatus and method for automatically tuning a signal in a dynamic application to continually and reliably remain within a predetermined voltage range so as to avoid overpowering or underpowering devices to which the signal is transmitted.

Another object of the present invention is to provide an apparatus and method for automatically and periodically tuning a signal which accommodates and minimizes the effects of temperature and other variable conditions on the signal.

Another object of the present invention is to provide an apparatus and method for continually varying the impedance of an amplifier feedback path based on the level of the amplified signal.

Yet another object of the present invention is to provide an apparatus and method for automatically tuning a signal which enables the signal to be continually monitored and tuned during a processing operation to adapt to changing conditions and effects on the signal.

A further object of the present invention is to provide an apparatus and method for automatically and periodically tuning a signal with the above named advantages, which can be used in combination with a linear displacement detector and, in particular, with a magnetostrictive linear displacement transducer.

Another object of the present invention is to provide a magnetostrictive linear displacement transducer that is less prone to errors caused by shocks or vibrations.

To achieve the foregoing and other objects, and in accordance with the purposes of the present invention as described above, an apparatus for automatically and periodically tuning a signal is provided comprising a gain element having an input for receiving the signal and an output for supplying an output signal, a variable impedance associated with the gain element, and a control device. The setting of the variable impedance controls the gain of the gain element. The control device receives the gain element output signal and generates a control signal in response to the amplitude of the gain element output signal. The control signal is transmitted to the variable impedance to regulate the setting of the impedance. If the control device determines that the gain element output signal is too weak, the device generates a control signal that will regulate the variable impedance such that the gain of the gain element is increased. Likewise, if the control device determines that the gain element output signal is too strong, the device generates a control signal that will regulate the variable impedance such that the gain of the gain element is decreased.

Still other objects of the present invention will become apparent to those skilled in this art from the following description wherein there is shown and described a preferred embodiment of this invention, simply by way of illustration, of one of the best modes contemplated for carrying out the invention. As will be realized, the invention is capable of other different, obvious aspects all without departing from the invention.

BRIEF DESCRIPTION OF THE DRAWINGS

While the specification concludes with claims particularly pointing out and distinctly claiming the present invention, it is believed the same will be better understood from the following description taken in conjunction with the accompanying drawings in which:

DETAILED DESCRIPTION OF THE PREFERRED EMBODIMENTS

Figure 1:
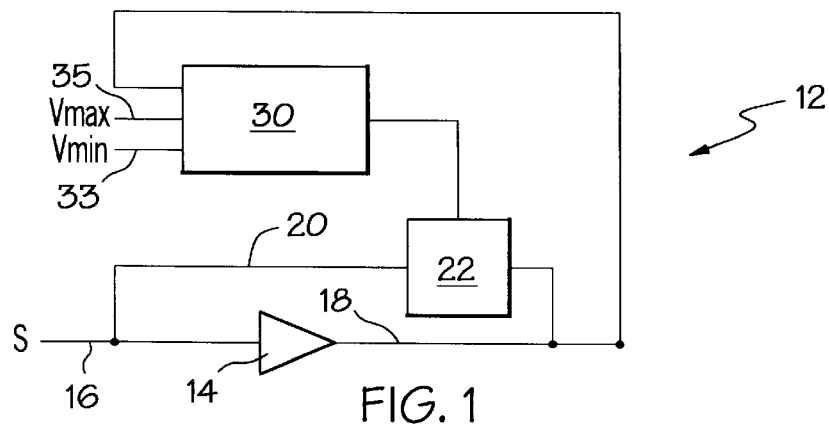
FIG. 1 is a schematic diagram of an automatic signal tuning apparatus of the present invention.
Figure 2:
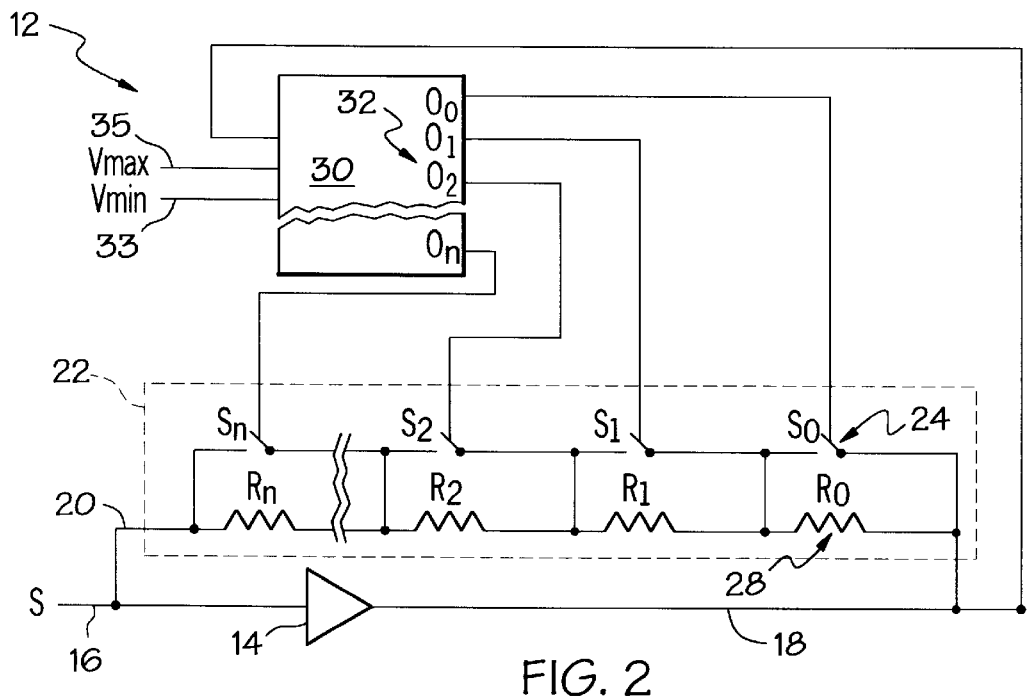
FIG. 2 is a schematic diagram of the automatic signal tuning apparatus of FIG. 1, depicting a preferred embodiment of the variable impedance in greater detail.
Figure 4:
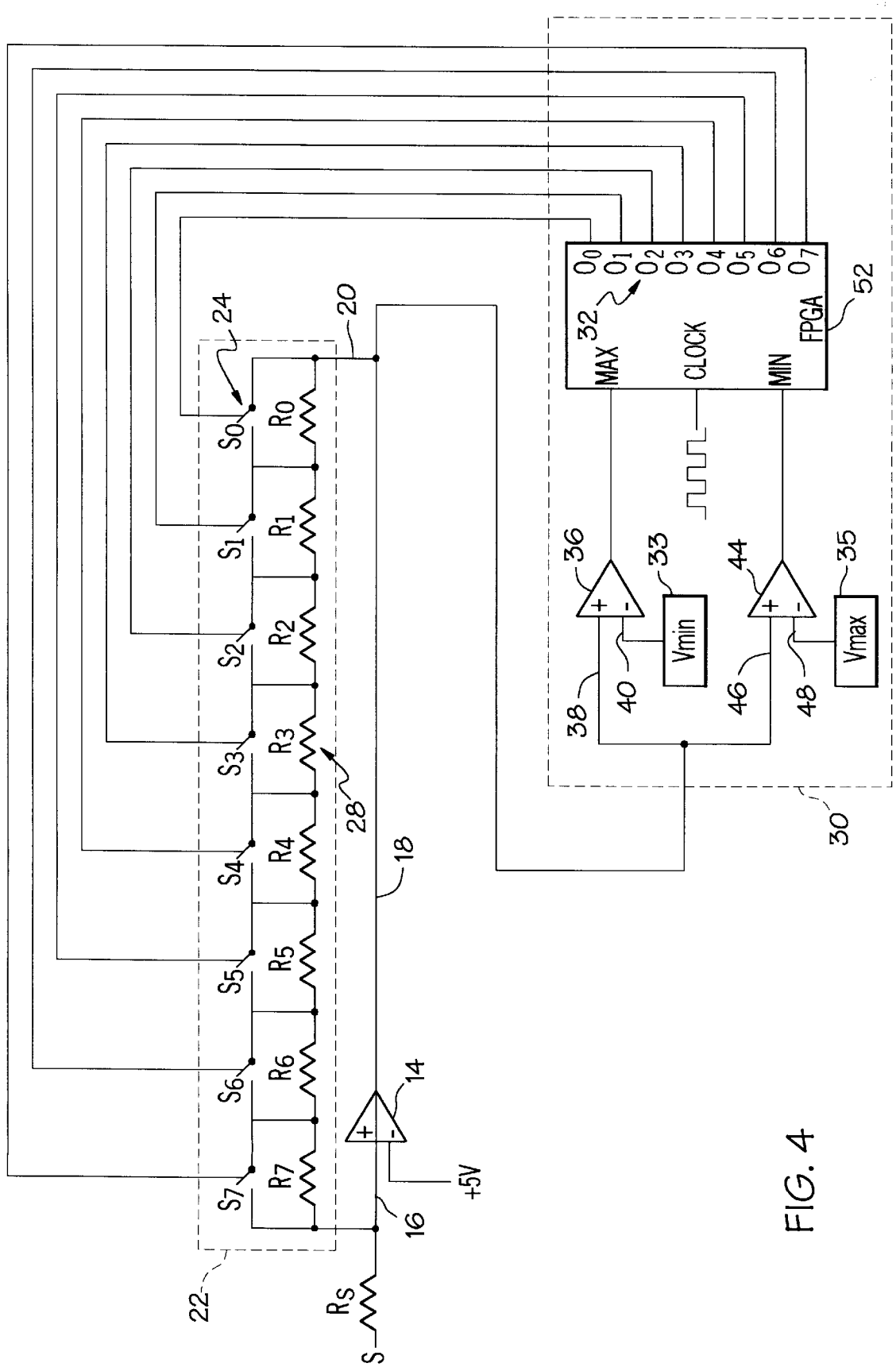
FIG. 4 is a schematic diagram of a preferred embodiment of the automatic signal tuning apparatus of the present invention.

Referring now to the drawings in detail, wherein like numerals indicate the same elements throughout the views, FIGS. 1, 2, and 4 depict, in varying degrees of detail, a representative preferred embodiment of an automatic signal tuning apparatus, designated generally as 12, made in accordance with the present invention. As shown in the figures, exemplary apparatus 12 is illustrated as including a gain element 14, a variable impedance 22, and a control device 30. In the representative embodiment, the gain element is an operational amplifier 14 having at least one input 16 for receiving the signal to be tuned S, an output 18 for supplying an output signal, and a feedback path 20 extending from the output 18 to the input 16. The operational amplifier 14 has two inputs, one of which receives the signal to be tuned S through a resistance $R_s$, as shown in FIG. 4. While gain element 14 is depicted in the representative embodiment as an operational amplifier, it is to be understood that such gain element may comprise other devices or circuits that can vary the amplitude of a signal, such as a bipolar junction transistor amplifier or other devices to accomplish the same, without departing from the scope of the invention.

As shown in FIGS. 1, 2, and 4, a feedback path 20 extends between the output 18 and input 16 of the amplifier 14. A variable impedance 22 is provided in the feedback path 20 for varying the gain of the amplifier 14. As will be appreciated, the greater the impedance provided in the feedback path 20, the greater the gain of the amplifier 14. In the embodiment shown in FIG. 2, the variable impedance 22 includes a plurality of resistors 28, shown as $R_0$ through $R_n$, and a plurality of switches 24, shown as $S_0$ through $S_n$. The resistors 28 are preferably connected in series in the feedback path 20 and each of the resistors has a switch 24 associated therewith. Each switch 24 is also preferably connected in parallel with the associated resistor 28 for switching the resistor into or out of the feedback path 20. In the representative embodiment shown in FIG. 4, the variable impedance 22 consists of eight resistors, $R_0$–$R_7$, and eight switches, $S_0$–$S_7$. Preferably, the resistors 28 increase in resistance from $R_0$ to $R_7$ in a binary increasing fashion. Thus, $R_1$ preferably has a resistance value of $2^1$ times $R_0$, $R_2$ preferably has a resistance value of $2^2$ times $R_0$, $R_3$ preferably has a resistance value of $2^3$ times $R_0$, and so on. For example, if $R_0$ had a resistance value of 180 ohms, $R_1$ would have a preferred resistance of 360 ohms, $R_2$ would have a preferred resistance of 520 ohms, $R_3$ would have a preferred resistance value of 1440 ohms, and so on.

In addition to the operational amplifier 14, the feedback path 20, and the variable impedance 22, the representative embodiment of the apparatus also includes a control device 30. As shown in FIG. 1, in the representative embodiment of the present invention the signal from the amplifier 14 is input to the control device 30. The control device 30 generates a control signal, based on the signal from the amplifier 14, which is transmitted to the variable impedance 22 to control the impedance. Preferably, and as shown in FIG. 2, the control signal is provided as numerous switching signals 32, shown as $O_0$–$O_n$. In use, the switching signals 32 are provided to the switches 24 associated with the variable impedance 22. Preferably, there is one switching signal for each switch in the feedback path. Therefore, for the representative embodiment shown in FIGS. 3 and 4, there are eight switching signals 32, shown as $O_0$–$O_7$, provided to correspond with the eight resistors and switches mentioned above. However, it is to be understood that other configurations of switches, switching signals, and resistors may be provided without departing from the scope of the invention.

Figure 3:
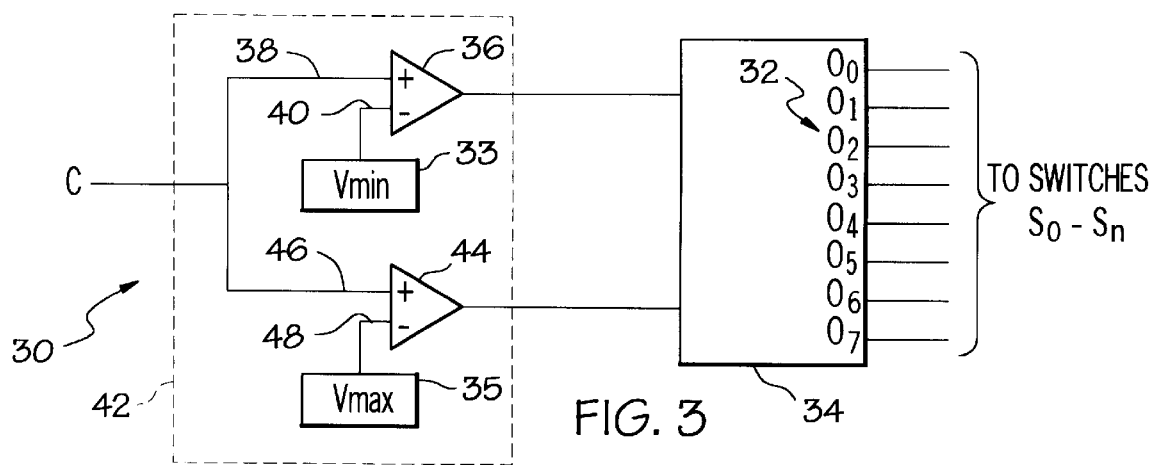
FIG. 3 is a schematic diagram depicting a preferred embodiment of the control device of FIG. 1 in greater detail.

FIG. 3 shows a preferred embodiment of a control device 30 of the present invention, which is illustrated as including a voltage evaluating element 42 and a control circuit 34. As shown in FIGS. 3 and 4, the voltage evaluating element 42 preferably comprises a pair of comparators 36 and 44. The first comparator 36 is supplied with the output signal of the operational amplifier 14, shown as C, at a first input 38, and with a predetermined minimum reference voltage 33 at a second input 40. The second comparator 44 is also supplied with the output signal C of the operational amplifier 14 at a first input 46, and with a predetermined maximum reference voltage 35 at a second input 48. In this embodiment, the first comparator 36 generates a first output signal and the second comparator 44 generates a second output signal. The control circuit 34 receives the first and second output signals from the comparators 36, 44 and generates a plurality of corresponding switching signals 32 which are supplied to the switches 24 of the variable impedance 22. In the representative embodiment depicted in FIG. 4, the control circuit 34 comprises a field programmable gate array (FPGA) 52, however, it is to be understood that the control circuit 34 may consist of other elements or circuits, such as an application specific integrated circuit, without departing from the scope of the invention.

Figure 5:
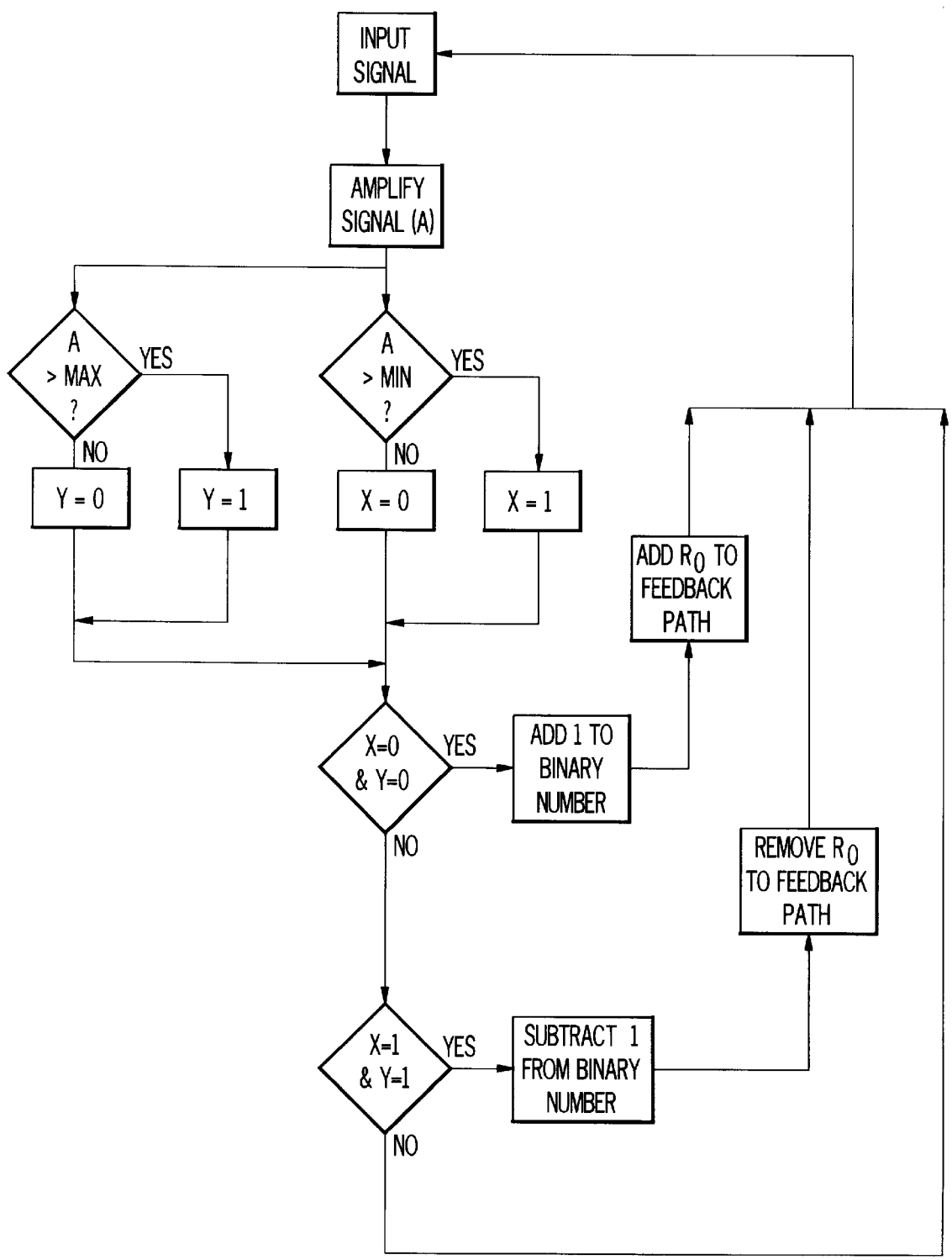
FIG. 5 is a flow diagram for an automatic signal tuning apparatus of the present invention.

The representative embodiment of the apparatus of FIG. 4 operates generally as represented by the flow diagram of FIG. 5. When an input signal S is received at the input 16 of the operational amplifier 14, the amplifier amplifies the signal and provides the amplified signal at the output 18. The flow diagram of FIG. 5 designates the amplified signal as A. The output signal of the amplifier 14 travels along the feedback path 20 to the switches 24 and resistors 28 of the variable impedance 22. As will be apparent, if a particular switch is closed, the signal will bypass the resistor with which the switch is associated because the signal will choose the path of least resistance.

Similarly, if a particular switch is open, the signal will be forced to pass through the resistor with which the switch is associated. Thus, if all switches 24 are open, the signal traveling through the feedback path 20 encounters a resistance equal to $R_0+R_1+R_2+R_3+R_4+R_5+R_6+R_7$. If only switches $S_0$–$S_3$ are open, the signal encounters a resistance of $R_0+R_1+R_2+R_3$. If all switches 24 are closed, the signal encounters no resistance. The amount of resistance encountered in the feedback path 20 is significant because, as noted above, this feedback resistance is directly proportional to the amount of amplification, or gain, provided by the operational amplifier 14. This point is demonstrated in the following equation for the amplifier gain $U_{18}$, wherein the total feedback resistance is denoted as $R_{22}$:

$$U_{18} = \frac{S * R_{22}}{Rs}$$

Thus, the greater the resistance of the variable impedance 22, the greater the amplification provided at the output 18 of the amplifier 14.

As indicated in FIG. 4, in addition to being supplied to the feedback path 20, the output signal of the operational amplifier 14 is also supplied to the first input 38 of the first comparator 36 and the first input 46 of the second comparator 44. In a preferred embodiment, the first comparator 36 generates a first output signal that exists in a "high" state, representing a logical 1, when the amplitude of the amplifier output signal is greater than the minimum reference voltage 33, and in a "low" state, representing a logical 0, when the amplitude of the amplifier output signal is less than the minimum reference voltage. Similarly, the second comparator 44 generates a second output signal that exists in a "high" state when the amplitude of the amplifier output signal is greater than the maximum reference voltage 35, and in a "low" state when the amplitude of the amplifier output signal is less than the maximum reference voltage.

In the flow diagram of FIG. 5, the output signal of the first comparator 36 is represented as X, and the minimum reference voltage 33 is represented as "Min" Similarly, in FIG. 5 the output signal of the second comparator 44 is represented as Y and the maximum reference voltage 35 is represented as "Max". In this example, X equals 0 if the amplifier output signal A is less than the minimum reference voltage Min, and X equals 1 if A is greater than Min. Similarly, Y equals 0 if the amplifier output signal A is less than the maximum reference voltage Max, and Y equals 1 if A is greater than Max.

Upon evaluation by the comparators 36 and 44 of the amplifier output signal, the first and second output signals are produced and transmitted to the FPGA 52. The FPGA 52 evaluates the first and second output signals and generates a control signal in response thereto. The control signal includes the switching signals 32 mentioned above. As known in the art, the FPGA 52 will maintain the same switching signals at its outputs until the control logic instructs the FPGA to change the signals. As discussed above, each switching signal exists in either a high or a low state, and preferably represents a bit in a binary number.

Furthermore, each signal, or bit, is supplied to the switch corresponding to the bit's place in the binary number. Thus, for example, the signal corresponding to the least significant bit, $O_0$, is supplied to the switch connected to the resistor of lowest resistance, $R_0$, and the signal corresponding to the most significant bit, $O_n$, is supplied to the switch connected to the resistor of greatest resistance, $R_n$. Therefore, the exact order in which the resistors are connected does not matter, so long as each the switching signal 32 is connected to the switch 24 associated with the resistance of the same binary power. When a switching signal is in a high state, it represents a bit value of 1 and opens the switch to which it is connected. When a switching signal is in a low state, it represents a bit value of 0 and closes the switch to which it is connected.

The control logic of the FPGA 52 is preferably programmed such that the FPGA will increase and decrease the binary number, represented by the switching signals 32, according to the output signals of the comparators 36 and 44. As noted above, in a preferred embodiment, if the amplitude of the amplifier output signal is less than the predetermined minimum reference voltage 33, the output signals from the first and second comparators will be low. During each predetermined signal period, the FPGA will evaluate the output signals from the comparators. If the output signals are both low, the FPGA 52 will add 1 to the binary number. This addition to the binary number will alter the switching signals output from the FPGA 52, such that additional resistance, equal to the resistance $R_0$, will be added into the feedback path 20 in order to increase the gain of the operational amplifier 14.

In contrast, if during a signal period the amplitude of the amplifier output signal is greater than the predetermined maximum reference voltage 35, the output signals from the comparators will be in a high state. Thus, the FPGA 52 will subtract 1 from the binary number. This subtraction from the binary number will alter the switching signals from the FPGA 52, such that a resistance, equal to the resistance $R_0$, will be removed from the feedback path 20 in order to decrease the gain of the operational amplifier 14.

If the amplifier output signal is between the predetermined minimum reference voltage 33 and the predetermined maximum reference voltage 35, the output signal from the first comparator will be high and the output signal from the second comparator will be low. Based on this output, the FPGA 52 will not change the binary number. Thus, the FPGA 52 will maintain the switching signals 32 in the same state, and the resistance in the feedback path 20, as well as the gain of the operational amplifier 14, will remain the same. This operation of the representative embodiment of FIG. 4 is depicted by FIG. 5 and by the following chart in which $R_n$ represents the resistance value existing from the previous signal period:

| State | Comparator 1 output (X) | Comparator 2 output (Y) | FPGA operation | Resistance |
|---|---|---|---|---|
| 1 | 0 | 0 | increment (+1) | $R_n + 1 = R_n + R_0$ |
| 2 | 1 | 0 | no change | $R_n = R_n$ |
| 3 | 1 | 1 | decrement (−1) | $R_n - 1 = R_n - R_0$ |

In addition, the following chart depicts the correspondence between the resistance and the binary outputs of the FPGA 52 of the representative embodiment of FIG. 4:

| binary output | $2^7$ | $2^6$ | $2^5$ | $2^4$ | $2^3$ | $2^2$ | $2^1$ | $2^0$ |
|---|---|---|---|---|---|---|---|---|
| resistance | $2^7 R_0$ | $2^6 R_0$ | $2^5 R_0$ | $2^4 R_0$ | $2^3 R_0$ | $2^2 R_0$ | $2^1 R_0$ | $2^0 R_0$ |

Thus, because the apparatus 12 increases the gain of the amplifier 14 when the amplifier output signal is too low, and decreases the gain of the amplifier when the amplifier output signal is too high, the amplifier signal is automatically and continually tuned to a range of voltages defined by the predetermined minimum reference voltage 33 and the predetermined maximum reference voltage 35. In this manner, the apparatus will automatically and continually accommodate a dynamic environment while insuring consistency of operation and reliability. The reference voltages which are supplied to the comparators 36 and 44 may be adjusted according to the specifications of the signal processing device to which the signal will be fed.

While the FPGA 52 of the embodiment depicted in FIG. 4 is used to control the gain of the amplifier 14, it is to be understood that the FPGA 52 may simultaneously be utilized for other purposes, including further processing of the amplifier output signal, without departing from the scope of the present invention. In addition, while the invention has been described with respect to providing a tuned signal for signal processing devices, it is to be understood that the invention is applicable to other circuits, equipment, and processes that require an input signal within a certain voltage range for optimum performance.

Furthermore, in the representative embodiment of FIG. 4, eight resistors and switches are provided in the feedback path 20, and each switch is controlled by one of eight switching signals 32 from the control circuit 34. However, it is to be understood that any number of resistors, switches, and switching signals may be provided without departing from the scope of the invention, provided there is a switching signal associated with each resistor.

Figure 6:
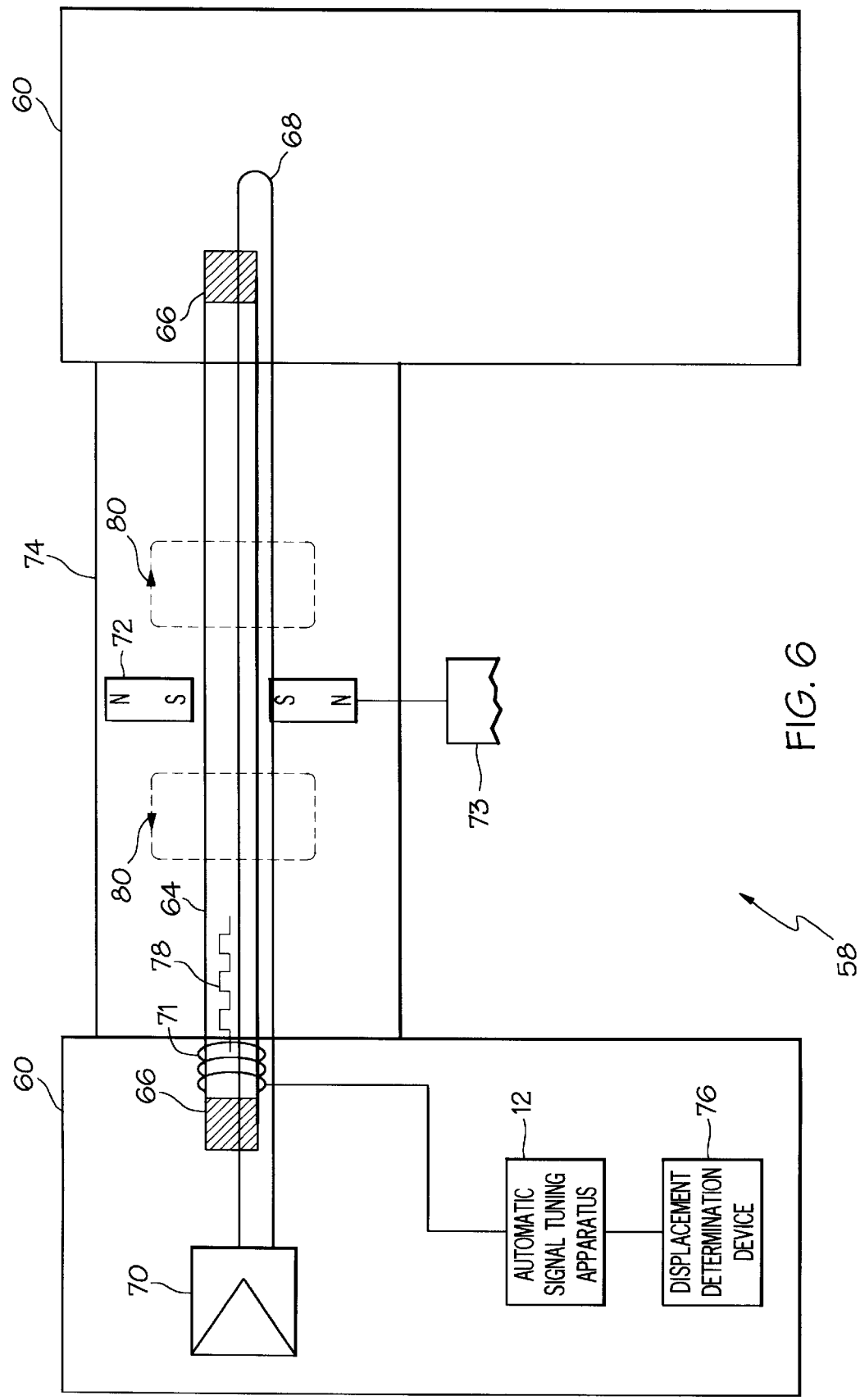
FIG. 6 is a partial schematic view of an exemplary magnetostrictive linear displacement transducer incorporating the automatic signal tuning apparatus of FIG. 1.

FIG. 6 is a partial schematic view of a magnetostrictive linear displacement transducer 58 incorporating an automatic signal tuning apparatus of the present invention. As shown in the drawing, the transducer 58 includes housing members 60, a waveguide 64, a coil 71, and a magnet 72. The waveguide 64 is made of a magnetostrictive material. It is to be understood that the waveguide 64 may be secured using any of a variety of known methods without departing from the scope of the invention. In addition, the waveguide 64 is preferably tubular in shape and may include a damping material 66.

A pulse generator 70 is also located within the housing 60. A conductive wire 68 connects to the generator 70 and preferably extends through the interior of the waveguide 64 and returns to the generator 70 on the exterior of the waveguide 64. A mode convertor, shown in the representative embodiment as a coil 71, is disposed proximate to the waveguide 64. Preferably, the coil 71 surrounds the waveguide 64 without making contact with the waveguide 64. The magnet 72 is disposed linearly along the waveguide 64 and is connected to an object 73, so that the position of the magnet along the waveguide corresponds to the position of the object. The magnet 72 may comprise one or more magnetic slugs embedded in a ring-shaped member (such as a "donut" of aluminum material) or any other arrangement known in the art. Preferably, the waveguide 64, wire 68, and magnet 72 are shielded by an outer tube 74. The automatic signal tuning apparatus 12 described above is connected to the output of the coil 71, and a displacement determination device 76 is connected to the apparatus to process the signal from the coil 71, as will be described in more detail below.

The operation of the transducer will now be described in more detail. To operate the transducer, the pulse generator 70 periodically generates an excitation signal 78 which is transmitted through the wire 68. A signal 78 is transmitted through the wire once during each measuring period of the transducer. In a representation embodiment, the measuring period of the transducer is approximately 1 millisecond.

When the excitation signal 78 passes through the wire 68, the signal combines with the magnetic field of the magnet 72 to create a torsion wave 80 within the waveguide 64. The torsion wave 80 propagates away from the magnet 72 toward the ends of the waveguide 64. When the torsion wave 80 reaches the coil 71, the coil converts the wave 80 into an electrical signal. The damping material 66 mentioned above serves to dampen the wave 80 and prevent it from reverberating through the waveguide 64. The electrical signal from the coil 71 is transmitted to the automatic signal tuning apparatus 12 where it is tuned to within a predetermined voltage range as described above. The displacement indication device 76 receives the tuned output from the apparatus 12 and measures the interval of time between the production of the excitation signal 78 and the receipt of the tuned output signal. Using the interval of time and the known speed of the torsion wave 80 in the waveguide 64, the device 76 determines the distance traveled by the torsion wave 80 and, thus, the position of the object 73.

In a preferred arrangement, the displacement indication device 76 utilizes the same FPGA 52 which is used in the apparatus 12 to measure the interval of time between the production of the excitation signal and the receipt of the tuned output signal. In addition, the apparatus 12 described above, preferably evaluates the signals from the comparators 36, 44 and alters the resistance in the feedback path 20, if necessary, during each measuring period. Thus, each signal generated by the coil is passed through the amplifier 14 and evaluated by the comparators 36, 44. If the signal voltage is too low or too high, the resistance in the feedback path is adjusted, so that the gain of the amplifier is tuned prior to receipt of the next coil signal.

In the representative embodiment of FIG. 6, a magnetostrictive linear displacement transducer 58 utilizes a pulse generator 70 and a displacement indication device 76 that are separate from the automatic signal tuning apparatus 12. However, it is to be understood that the field programmable gate array 52, or other device utilized in the signal tuning apparatus 12, may also serve as the generator 70 and/or as part of the displacement indication device 76, without departing from the scope of the invention.

Figure 7:
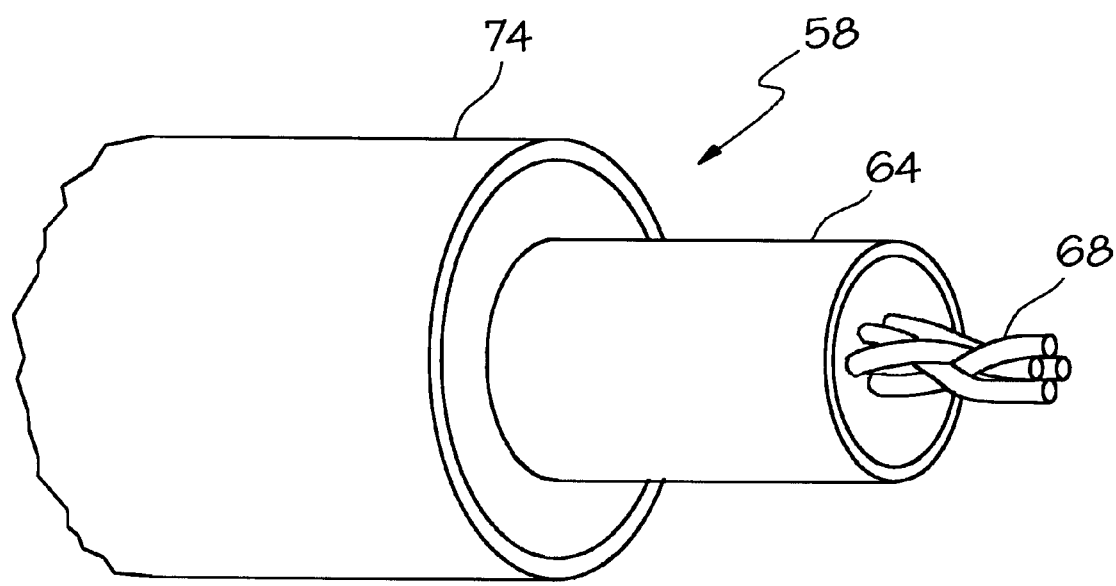
FIG. 7 is a partial, side perspective view of an exemplary magnetostrictive linear displacement transducer having a stranded conductive wire.

FIG. 7 illustrates an alternative embodiment for a magnetostrictive linear displacement transducer 58, similar to the transducer depicted in FIG. 6, in which the conductive wire 68 is stranded. As shown in FIG. 7, in the alternative embodiment the solid wire shown in FIG. 6 is replaced with a wire having a plurality of individual strands of wire which are at least partially coextensive along the length of the waveguide. As shown in FIG. 7, the strands of wire may be bound or braided together. The use of such a wire in a magnetostrictive linear displacement transducer has been found to make the transducer less sensitive to shocks and vibrations and, thus, less apt to breakdown or produce erroneous output due to the decreased weight and increased flexibility produced by the strands. Using multiple strands rather than a single solid wire for the conductive wire 68 enables the wire to retain its shape better during vibrations, thereby reducing the likelihood that the wire will transfer the vibrations or contact the waveguide during vibrations. While the stranded conductive wire 68 is depicted in conjunction with a representative embodiment of a magnetostrictive linear displacement transducer, it should be understood that such a conductive wire could be applicable to magnetostrictive linear displacement transducers of other configurations. It should be further understood that it is possible to implement such a conductive wire in transducers that utilize an automatic signal tuning apparatus as well as those that do not utilize such an apparatus.

The foregoing description of preferred embodiments of the invention has been presented for purposes of illustration and description. It is not intended to be exhaustive or to limit the invention to the precise form disclosed. Obvious modifications or variations are possible in light of the above teachings. The embodiments shown and described were chosen in order to best illustrate the principles of the invention and its practical application to thereby enable one of ordinary skill in the art to best utilize the invention in various embodiments and with various modifications as are suited to the particular use contemplated. It is intended that the scope of the invention be defined by the claims appended hereto.

What is claimed is:

1. An apparatus for automatically and periodically tuning a signal, said apparatus comprising:

a gain element having an input adapted to receive the signal and an output adapted to supply a gain element output signal;

a variable impedance associated with the gain element and adapted to control the gain of the gain element; and a control device adapted to receive the gain element output signal and generate a first evaluation signal when the amplitude of the gain element output signal is less than a predetermined minimum reference, a second evaluation signal when the amplitude of the gain element output signal is between the predetermined minimum reference and a predetermined maximum reference, and a third evaluation signal when the amplitude of the gain element output signal is greater than the predetermined maximum reference, and wherein the control device increases the gain of the gain element when the first evaluation signal is generated and decreases the gain of the gain element when the third evaluation signal is generated.

2. The apparatus as recited in claim 1, wherein the control device further comprises:

a voltage evaluating element a predetermined maximum reference voltage, and the gain element output signal, and for which generates the evaluation signals, wherein the predetermined minimum reference comprises a voltage and the predetermined maximum reference comprises a voltage.

3. The apparatus as recited in claim 2, wherein the voltage evaluating element comprises:

a first comparator having a first input adapted to receive the gain element output signal and a second input adapted to receive the predetermined minimum reference voltage, the first comparator generating a first output signal having a first state when the amplitude of the gain element output signal is greater than the minimum reference voltage and a second state when the amplitude of the gain element output signal is less than the minimum reference voltage; and a second comparator having a first input adapted to receive the gain element output signal and a second input adapted to receive the predetermined maximum reference voltage, the second comparator generating a second output signal having a first state when the amplitude of the gain element output signal is greater than the maximum reference voltage and a second state when the amplitude of the gain element output signal is less than the maximum reference voltage, wherein the first evaluation signal is defined by the first output signal being in the second state, the second evaluation signal is defined by the first output signal being in the first state and the second output signal being in the second state, and the third evaluation signal is defined by the second output signal being in the first state.

4. The apparatus as recited in claim 3, wherein the control device further comprises a control circuit adapted to receive the first and second output signals from the comparators and generate a control signal in response to the states of the first and second output signals, the control signal increasing the variable impedance when the gain element output signal is less than the minimum reference voltage and decreasing the variable impedance when the gain element output signal is greater than the maximum reference voltage.

5. The apparatus as recited in claim 4, wherein the control circuit comprises an application-specific integrated circuit or a field programmable gate array.

6. The apparatus as recited in claim 1, wherein the control device generates a control signal in response to the evaluation signal, wherein the control signal corresponds to a binary number and wherein the control device includes control logic adapted to increase the binary number when the first evaluation signal is generated, and decrease the binary number when the third evaluation signal is generated.

7. The apparatus as recited in claim 1, wherein the gain element comprises an operational amplifier having a feedback path extending from the output to the input, the variable impedance being associated with the feedback path of the operational amplifier.

8. The apparatus as recited in claim 1, wherein the variable impedance comprises a plurality of impedance elements and a plurality of switches associated with the impedance elements, the switches being controlled in response to the evaluation signals.

9. The apparatus as recited in claim 8, wherein the plurality of impedances are resistors connected in series and wherein each resistor is connected in parallel to one of the switches.

10. The apparatus as recited in claim 1, further comprising a linear displacement detector to generate the signal, wherein the linear displacement detector is in communication with the gain element input and adapted to provide the signal to the gain element input.

11. The apparatus as recited in claim 10, wherein the linear displacement detector comprises a magnetostrictive linear displacement transducer having:
   a conductive wire;
   a pulse generator for providing an excitation signal through the conductive wire;
   a magnetostrictive waveguide at least partially surrounding the conductive wire;
   a magnet disposed linearly along the waveguide and the conductive wire such that a torsion wave is generated within the waveguide at the position of the magnet when an excitation signal is provided through the wire, the position of the magnet corresponding to the linear displacement to be detected;
   a mode converter disposed proximate to the magnetostrictive waveguide and linearly displaced from the magnet for converting the torsion wave within the waveguide into the signal, wherein the mode convertor is in communication with the gain element input and is adapted to provide the signal to the gain element input; and
   a displacement indication device in communication with the gain element output and the pulse generator.

12. A continuously self-tuning magnetostrictive linear displacement transducer for detecting linear displacement comprising:
   a conductive wire;
   a pulse generator for providing an excitation signal through the conductive wire;
   a magnetostrictive waveguide at least partially surrounding the conductive wire;
   a magnet disposed along the waveguide and the conductive wire such that a torsion wave is generated within the waveguide at the position of the magnet when an excitation signal is provided through the wire, the position of the magnet corresponding to the linear displacement to be detected;
   a mode converter disposed proximate to the magnetostrictive waveguide for converting the torsion wave into an input signal;
   an operational amplifier having an input for receiving the input signal and an output for supplying an amplified output signal;
   a feedback path extending from the output to the input of the operational amplifier;
   a plurality of resistors connected in series in the feedback path, each resistor being connected in parallel to a switch;
   a first comparator having a first input for receiving the amplified output signal and a second input for receiving a predetermined minimum reference voltage, the first comparator generating a first output signal having a first state when the amplitude of the amplified output signal is greater than the minimum reference voltage and a second state when the amplitude of the amplified output signal is less than the minimum reference voltage;
   a second comparator having a first input for receiving the amplified output signal and a second input for receiving a predetermined maximum reference voltage, the second comparator generating a second output signal having a first state when the amplitude of the amplified output signal is greater than the maximum reference voltage and a second state when the amplitude of the amplified output signal is less than the maximum reference voltage;
   a control device for receiving the first and second output signals and generating a plurality of switching signals in response to the first and second output signals, the switching signals corresponding to a binary number and being supplied to the switches, the control device having control logic for increasing the binary number when the amplitude of the amplified output signal is less than the minimum reference voltage and for decreasing the binary number when the amplitude of the amplified output signal is greater than the maximum reference voltage; and
   a displacement indication device associated with the operational amplifier and the signal generator for measuring the length of time between the transmission of the excitation signal by the generator and the production of the amplified output signal and for calculating linear displacement therefrom.

13. The transducer as recited in claim 12, wherein the conductive wire comprises a plurality of at least partially coextensive individual strands of wire.

14. A method for automatically and periodically tuning a signal comprising:
   amplifying the signal by passing the signal through a gain element having a variable impedance associated therewith;

generating a first signal when the amplitude of the amplified signal is less than a predetermined minimum reference voltage;

generating a second signal when the amplitude of the amplified signal is greater than a predetermined maximum reference voltage; and regulating the variable impedance based upon the first and second signals, such that if the amplitude of the amplified signal is less than the minimum reference voltage, the impedance is increased, and if the amplitude of the amplified signal is greater than the maximum reference voltage, the impedance is decreased.

15. The method as recited in claim 14, wherein the variable impedance comprises a plurality of impedance elements and a plurality of switches associated with the impedance elements and wherein the impedance is decreased by closing one or more of the switches and the impedance is increased by opening one or more of the switches.

16. The method as recited in claim 15, wherein the regulation step includes:

generating a control signal wherein the control signal comprises a plurality of switching signals, each switching signal existing in one of two states, and wherein the plurality of switching signals corresponds to a binary number;

increasing the binary number when the amplitude of the amplified signal is less than the minimum reference voltage; and decreasing the binary number when the amplitude of the amplified signal is greater than the maximum reference voltage; and supplying each switching signal to one of the switches of the variable impedance for control of the state of the switch.

17. The method as recited in claim 16, wherein each switching signal corresponds to a bit in the binary number, the bits being arranged in order from most significant to least significant, and wherein the bits are supplied to the switches in order such that the least significant bit is supplied to the switch connected to the resistance of lowest value and the most significant bit is supplied to the switch connected to the resistance of highest value.

18. An apparatus for automatically and periodically tuning a signal, said apparatus comprising:

a gain element having an input adapted to receive the signal and an output adapted to supply a gain element output signal;

a variable impedance associated with the gain element and adapted to control the gain of the gain element; and a control device adapted to receive the gain element output signal and generate a control signal in response to the amplitude of the gain element output signal, wherein the control signal is transmitted to the variable impedance for regulation thereof, and wherein the control device comprises:

a voltage evaluating element adapted to receive a predetermined minimum reference voltage, a predetermined maximum reference voltage, and the gain element output signal, and to provide an output signal, the output signal having a first state if the gain element output signal is less than the minimum reference voltage, a second state if the gain element output signal is between the minimum and maximum reference voltages, and a third state if the gain element output signal is greater than the maximum reference voltage.

19. The apparatus as recited in claim 18, wherein the voltage evaluating element comprises:

a first comparator having a first input adapted to receive the gain element output signal and a second input adapted to receive the predetermined minimum reference voltage, the first comparator generating a first output signal having a first state when the amplitude of the gain element output signal is greater than the minimum reference voltage and a second state when the amplitude of the gain element output signal is less than the minimum reference voltage; and a second comparator having a first input adapted to receive the gain element output signal and a second input adapted to receive the predetermined maximum reference voltage, the second comparator generating a second output signal having a first state when the amplitude of the gain element output signal is greater than the maximum reference voltage and a second state when the amplitude of the gain element output signal is less than the maximum reference voltage.

20. The apparatus as recited in claim 19, wherein the control device further comprises a control circuit adapted to receive the first and second output signals and generate the control signal in response to the states of the first and second output signals, the control signal increasing the variable impedance when the gain element output signal is less than the minimum reference voltage and decreasing the variable impedance when the gain element output signal is greater than the maximum reference voltage.

21. The apparatus as recited in claim 20, wherein the control circuit comprises an application-specific integrated circuit or a field programmable gate array.

22. An apparatus for automatically and periodically tuning a signal, said apparatus comprising:

a gain element having an input adapted to receive the signal and an output adapted to supply a gain element output signal;

a variable impedance associated with the gain element and adapted to control the gain of the gain element; and a control device adapted to receive the gain element output signal and generate a control signal in response to the amplitude of the gain element output signal, wherein the control signal is transmitted to the variable impedance for regulation thereof, wherein the control signal corresponds to a binary number and wherein the control device includes control logic adapted to increase the binary number when the amplitude of the gain element output signal is less than the minimum reference voltage and decrease the binary number when the amplitude of the gain element output signal is greater than the maximum reference voltage.

23. A method for automatically and periodically tuning a signal comprising:

amplifying the signal by passing the signal through a gain element having a variable impedance associated therewith;

comparing the amplified signal to a minimum reference voltage and maximum reference voltage; and regulating the variable impedance based upon the results of the comparison step, such that if the amplitude of the amplified signal is less than the minimum reference voltage, the impedance is increased, and if the amplitude of the amplified signal is greater than the maximum reference voltage, the impedance is decreased, wherein the variable impedance comprises:

a plurality of impedance elements and a plurality of switches associated with the impedance elements, wherein the impedance is decreased by closing one or more of the switches and the impedance is increased by opening one or more of the switches, and wherein the regulation step includes:

generating a control signal wherein the control signal comprises a plurality of switching signals, each switching signal existing in one of two states, and wherein the plurality of switching signals corresponds to a binary number;

increasing the binary number when the amplitude of the amplified signal is less than the minimum reference voltage;

decreasing the binary number when the amplitude of the amplified signal is greater than the maximum reference voltage; and supplying each switching signal to one of the switches of the variable impedance for control of the state of the switch.

24. The method as recited in claim 23, wherein each switching signal corresponds to a bit in the binary number, the bits being arranged in order from most significant to least significant, and wherein the bits are supplied to the switches in order such that the least significant bit is supplied to the switch connected to the resistance of lowest value and the most significant bit is supplied to the switch connected to the resistance of highest value.

25. The apparatus as recited in claim 11, wherein the conductive wire comprises a plurality of strands of wire.

* * * * *

UNITED STATES PATENT AND TRADEMARK OFFICE
CERTIFICATE OF CORRECTION

PATENT NO. : 5,923,164
DATED : July 13, 1999
INVENTOR(S) : Ehling et al.

It is certified that error appears in the above-identified patent and that said Letters Patent is hereby corrected as shown below:

Claim 2, column 10, lines 38-40, delete "a predetermined maximum reference voltage, and the gain element output signal, and for".

Signed and Sealed this

Seventh Day of December, 1999

Attest:

Q. TODD DICKINSON

Attesting Officer

*Acting Commissioner of Patents and Trademarks*